US009362267B2

(12) United States Patent
Briere et al.

(10) Patent No.: US 9,362,267 B2
(45) Date of Patent: Jun. 7, 2016

(54) GROUP III-V AND GROUP IV COMPOSITE SWITCH

(71) Applicant: International Rectifier Corporation, El Segundo, CA (US)

(72) Inventors: Michael A. Briere, Scottsdale, AZ (US); Tim McDonald, Redondo Beach, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 129 days.

(21) Appl. No.: 13/780,436

(22) Filed: Feb. 28, 2013

(65) Prior Publication Data

US 2013/0240898 A1    Sep. 19, 2013

Related U.S. Application Data

(60) Provisional application No. 61/611,369, filed on Mar. 15, 2012.

(51) Int. Cl.
| | |
|---|---|
| *H01L 21/00* | (2006.01) |
| *H01L 27/04* | (2006.01) |
| *H01L 25/07* | (2006.01) |
| *H01L 25/18* | (2006.01) |
| *H01L 29/20* | (2006.01) |

(52) U.S. Cl.
CPC ............. *H01L 27/04* (2013.01); *H01L 25/07* (2013.01); *H01L 25/18* (2013.01); *H01L 29/2003* (2013.01); *H01L 2224/16* (2013.01); *H01L 2924/13062* (2013.01); *H01L 2924/13091* (2013.01)

(58) Field of Classification Search
CPC ..... H01L 27/04; H01L 29/2003; H01L 25/07; H01L 25/18; H01L 2924/13062; H01L 2924/13091; H01L 2224/16
See application file for complete search history.

(56) References Cited

U.S. PATENT DOCUMENTS

| | | | |
|---|---|---|---|
| 3,648,131 | A  | 3/1972 | Stuby |
| 7,166,867 | B2 | 1/2007 | Beach |
| 7,915,645 | B2 | 3/2011 | Briere |
| 8,018,056 | B2 | 9/2011 | Hauenstein |

(Continued)

FOREIGN PATENT DOCUMENTS

| | | |
|---|---|---|
| EP | 2 256 799 A2 | 12/2010 |
| EP | 2256799 | 12/2010 |

(Continued)

OTHER PUBLICATIONS

U.S. Appl. No. 61/473,907, filed Apr. 11, 2011, McDonald.

(Continued)

*Primary Examiner* — Laura Menz
(74) *Attorney, Agent, or Firm* — Farjami & Farjami LLP

(57) ABSTRACT

In one implementation, a group III-V and group IV composite switch includes a group IV transistor in a lower active die, the group IV transistor having a source and a gate situated on a bottom side of the lower active die. The group III-V and group IV composite switch also includes a group III-V transistor in an upper active die stacked over the lower active die, the group III-V transistor having a drain, a source, and a gate situated on a top side of the upper active die. The source of the group III-V transistor is electrically coupled to a drain of the group IV transistor using a through-semiconductor via (TSV) of the upper active die.

10 Claims, 11 Drawing Sheets

Group III-V and Group IV Composite Switch Cross Section

(56) References Cited

U.S. PATENT DOCUMENTS

| | | |
|---|---|---|
| 8,847,408 B2 | 9/2014 | Lin |
| 2003/0057459 A1 | 3/2003 | Rumennik |
| 2003/0151064 A1 | 8/2003 | Ohno |
| 2003/0155644 A1 | 8/2003 | Hirao |
| 2005/0001235 A1 | 1/2005 | Murata |
| 2008/0191216 A1 | 8/2008 | Machida |
| 2009/0008679 A1 | 1/2009 | Saito |
| 2009/0051043 A1 | 2/2009 | Wong |
| 2009/0057872 A1 | 3/2009 | Ehlers |
| 2009/0108467 A1 | 4/2009 | Otremba |
| 2009/0189191 A1 | 7/2009 | Sato |
| 2009/0256196 A1 | 10/2009 | Wang |
| 2009/0278167 A1 | 11/2009 | Ozoe |
| 2010/0012934 A1 | 1/2010 | Jung |
| 2010/0019397 A1 | 1/2010 | Youn |
| 2010/0140805 A1 | 6/2010 | Chang |
| 2010/0155932 A1 | 6/2010 | Gambino |
| 2010/0259201 A1 | 10/2010 | Kawano |
| 2010/0289092 A1 | 11/2010 | Pering |
| 2010/0301396 A1* | 12/2010 | Briere ................ H01L 21/8221 257/195 |
| 2011/0049580 A1 | 3/2011 | Lui |
| 2011/0095367 A1 | 4/2011 | Su |
| 2011/0136325 A1 | 6/2011 | Briere |
| 2011/0169549 A1 | 7/2011 | Wu |
| 2012/0028436 A1 | 2/2012 | Or-Bach |
| 2012/0193785 A1 | 8/2012 | Lin |
| 2012/0223322 A1* | 9/2012 | Lin ..................... H01L 27/0727 257/76 |
| 2012/0256188 A1* | 10/2012 | McDonald ............ H01L 25/074 257/76 |
| 2012/0256189 A1* | 10/2012 | McDonald ............ H01L 25/074 257/76 |
| 2012/0256190 A1* | 10/2012 | McDonald .............. H01L 25/18 257/76 |
| 2012/0274366 A1* | 11/2012 | Briere ................... H02M 7/003 327/108 |
| 2013/0175542 A1* | 7/2013 | Briere ...................... H01L 25/18 257/76 |
| 2013/0240898 A1* | 9/2013 | Briere ..................... H01L 27/04 257/76 |
| 2014/0035005 A1 | 2/2014 | Briere |
| 2014/0225162 A1* | 8/2014 | Briere ................ H01L 21/8252 257/195 |

FOREIGN PATENT DOCUMENTS

| | | | |
|---|---|---|---|
| EP | 2639829 A2 * | 9/2013 | ............. H01L 27/04 |
| EP | 2639832 A2 * | 9/2013 | ............. H01L 25/07 |
| JP | S 62-52954 | 3/1987 | |
| JP | H 10-163333 | 6/1998 | |
| JP | 2006-351691 | 12/2006 | |
| JP | 2007/048842 A | 2/2007 | |
| JP | H 11-3916 | 1/2011 | |

OTHER PUBLICATIONS

U.S. Appl. No. 61/611,369, filed Mar. 15, 2012, McDonald.
U.S. Appl. No. 13/433,864, filed Mar. 29, 2012, McDonald.
U.S. Appl. No. 13/434,412, filed Mar. 29, 2012, McDonald.
U.S. Appl. No. 13/434,524, filed Mar. 29, 2012, McDonald.
U.S. Appl. No. 13/781,080, filed Feb. 28, 2013, Briere.
U.S. Appl. No. 61/448,617, filed Mar. 2, 2011, Lin.
U.S. Appl. No. 61/448,347, filed Mar. 2, 2011, Lin.
European Search Report on European Patent Application No. EP 10 00 4470.

* cited by examiner

US 9,362,267 B2

GROUP III-V AND GROUP IV COMPOSITE SWITCH

The present application claims the benefit of and priority to a provisional application entitled "Group III-Nitride and Group IV Leadless Packaged Composite Device," Ser. No. 61/611,369 filed on Mar. 15, 2012. The disclosure in this provisional application is hereby incorporated fully by reference into the present application.

BACKGROUND

I. Definitions

As used herein, the phrase "group III-V" refers to a compound semiconductor including at least one group III element and at least one group V element. By way of example, a group III-V semiconductor may take the form of a III-Nitride semiconductor. "III-Nitride" or "III-N" refers to a compound semiconductor that includes nitrogen and at least one group III element including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar, or non-polar crystal orientations. A III-Nitride material may also include either the Wurtzitic, Zincblende, or mixed polytypes, and may include single-crystal, monocrystalline, polycrystalline, or amorphous structures. Gallium nitride or GaN, as used herein, refers to a III-Nitride compound semiconductor wherein the group III element or elements include some or a substantial amount of gallium, but may also include other group III elements in addition to gallium.

Also as used herein, the phrase "group IV" refers to a semiconductor that includes at least one group IV element such as silicon (Si), germanium (Ge), and carbon (C), and also includes compound semiconductors such as silicon germanium (SiGe) and silicon carbide (SiC), for example. Group IV also refers to semiconductor materials which include more than one layer of group IV elements, or doping of group IV elements to produce strained group IV material, and may also include group IV based composite substrates such as silicon on insulator (SOI), separation by implantation of oxygen (SIMOX) process substrates, and silicon on sapphire (SOS), for example.

Moreover, and as also used herein, the phrase "LV transistor" refers to a low-voltage transistor, while the phrase "HV transistor" refers to a high-voltage transistor. Typical voltage ratings include LV~0V-50V, midvoltage (MV)~50V-300V, and HV~300V-1200V.

II. Background Art

In high power and high performance circuit applications, group III-V transistors, such as III-Nitride field-effect transistors (FETs) and high mobility electron transistors (HEMTs), are often desirable for their high efficiency and high-voltage handling capability. Moreover, it is often desirable to combine such III-Nitride transistors with other FETs, such as silicon FETs, to create high performance composite switches.

In applications for which normally OFF switches are desirable, a depletion mode (normally ON) III-Nitride transistor can be cascoded with an enhancement mode (normally OFF) low-voltage (LV) group IV transistor to produce an enhancement mode (normally OFF) composite switch. However, conventional techniques for combining Nitride transistors with silicon FETs, for example, often offset the benefits provided by III-Nitride transistors. For instance, conventional composite designs may place the III-Nitride transistor and silicon FET side-by-side on a common support surface. Such a side-by-side configuration can undesirably increase the parasitic inductance and resistance in the current paths of the composite switch.

SUMMARY

The present disclosure is directed to a group III-V and group IV composite switch, substantially as shown in and/or described in connection with at least one of the figures, and as set forth more completely in the claims.

DETAILED DESCRIPTION

Figure 1:
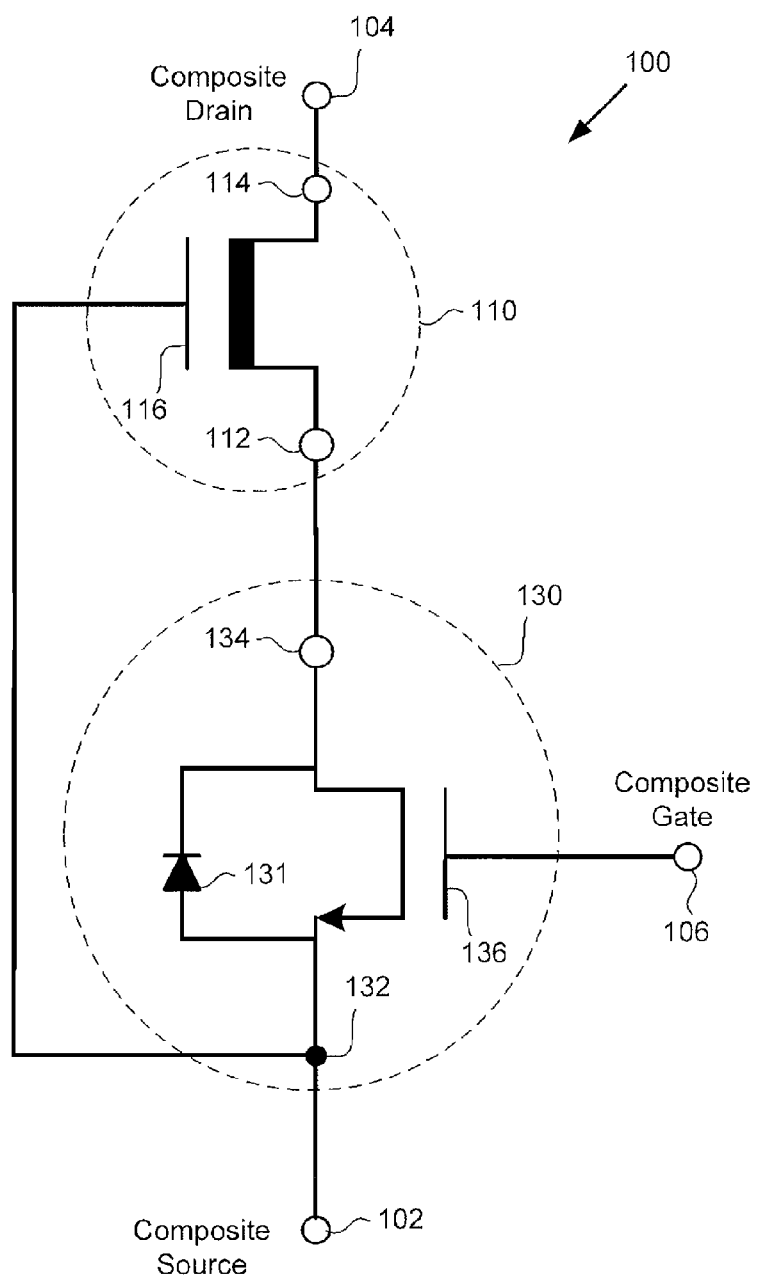
FIG. 1 shows a diagram of one exemplary implementation of a group III-V and group IV composite switch.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As noted above, in high power and high performance circuit applications, group III-V transistors, such as transistors fabricated from III-Nitride materials, are often desirable for their high efficiency and high-voltage handling capability. III-Nitride materials include, for example, gallium nitride (GaN) and its alloys such as aluminum gallium nitride (AlGaN), indium gallium nitride (InGaN), and aluminum indium gallium nitride (AlInGaN). These III-Nitride materials are semiconductor compounds having a relatively wide, direct bandgap and strong piezoelectric polarizations, and can enable high breakdown fields, high saturation velocities, and the creation of two-dimensional electron gases (2 DEGs). As a result, III-Nitride materials such as GaN are used in many microelectronic applications as depletion mode (i.e., normally ON) and enhancement mode (i.e., normally OFF) power field-effect transistors (FETs) and high electron mobility transistors (HEMTs), for example.

As further noted above, in power applications for which normally OFF switches are desirable, a depletion mode III-Nitride or other normally ON transistor can be cascoded with a low-voltage (LV) or midvoltage (MV) group IV transistor to produce an enhancement mode composite switch. However, the utility and reliability of such a composite switch can be compromised by conventional techniques for combining III-Nitride transistors with silicon or other group IV FETs, which can often negate the benefits provided by III-Nitride transistors. For example, conventional composite designs may place the III-Nitride transistor and silicon FET side-by-side on a common support surface implemented using a ceramic based substrate such as a direct bonded copper (DBC) substrate, a ceramic substrate on a Lead-frame, or an organic laminate substrate. Such side-by-side configuration can undesirably increase the parasitic inductance and resistance in the current paths of the composite power switch. As a result, a compact and cost-effective design solution for integrating III-Nitride or other group III-V transistors with group IV transistors, such as silicon FETs, is needed.

Various approaches related to potential design solutions are described in U.S. patent application Ser. No. 13/433,864, entitled "Stacked Composite Device Including a Group III-V Transistor and a Group IV Lateral Transistor," filed on Mar. 29, 2012; U.S. patent application Ser. No. 13/434,412, entitled "Stacked Composite Device Including a Group III-V Transistor and a Group IV Vertical Transistor," also filed on Mar. 29, 2012; and U.S. patent application Ser. No. 13/434,524, entitled "Stacked Composite Device Including a Group III-V Transistor and a Group IV Diode," filed on Mar. 29, 2012 as well, the entire disclosure of each of which is hereby incorporated fully by reference into the present application.

The present application is directed to a group III-V and group IV composite switch. According to one implementation, the composite switch may include a high-voltage (HV) III-Nitride power transistor cascoded with an LV or MV group IV transistor that may be configured as a vertical silicon FET, for example. The III-Nitride transistor, which may be a normally ON transistor, for example, can be connected in cascode with the LV or MV group IV transistor, which may be a normally OFF transistor, to provide a normally OFF composite switch. Moreover, the composite switch implementations disclosed by the present application are designed to substantially reduce parasitic inductance and resistance, as well as to enhance thermal dissipation when compared to conventional solutions.

Referring to FIG. 1, Figure shows one exemplary implementation of a group III-V and group IV composite switch.

As shown in FIG. 1, composite switch 100 includes group III-V transistor 110 cascoded with group IV transistor 130. Also shown in FIG. 1 are composite source 102, composite drain 104, and composite gate 106 of composite switch 100, as well as source 112, drain 114, and gate 116 of group III-V transistor 110, and body diode 131, source 132, drain 134, and gate 136 of group IV transistor 130.

Group III-V transistor 110 may be a normally ON III-Nitride power transistor and may be implemented as a depletion mode insulated-gate FET (IGFET), a junction FET (JFET), an accumulation mode FET (AccuFet), or as a heterostructure FET (HFET), for example. In one implementation, group III-V transistor 110 may take the form of a depletion mode metal-insulator-semiconductor FET (MISFET), such as a metal-oxide-semiconductor FET (MOSFET). Alternatively, when implemented as an HFET, group III-V transistor 110 may be a HEMT configured to produce a 2 DEG. According to one implementation, for example, group III-V transistor 110 may be an HV transistor. It is noted that in some implementations, composite switch 100 may utilize a group III-V FET or HEMT other than a III-Nitride FET or HEMT, such as a III-As, III-P or III-$As_aP_bN_{(1-a-b)}$ FET or HEMT, for example, as group III-V transistor 110.

Group IV transistor 130 may be implemented as an LV or MV group IV vertical transistor, such as a normally OFF silicon vertical transistor, for example. According to one implementation, group IV transistor 130 may be a silicon MISFET or MOSFET, for example. However, in other implementations, group IV transistor 130 may include any suitable group IV material, such as silicon carbide (SiC), germanium (Ge), silicon germanium (SiGe), or a strained group IV element or compound, for example.

The combination of group III-V transistor 110 and group IV transistor 130 provides composite switch 100, which according to the implementation shown in FIG. 1 can be configured as a composite three terminal device functioning in effect as a normally OFF composite transistor having composite source 102 and composite gate 106 provided by group IV transistor 130, and composite drain 104 provided by group III-V transistor 110.

Figure 2A:
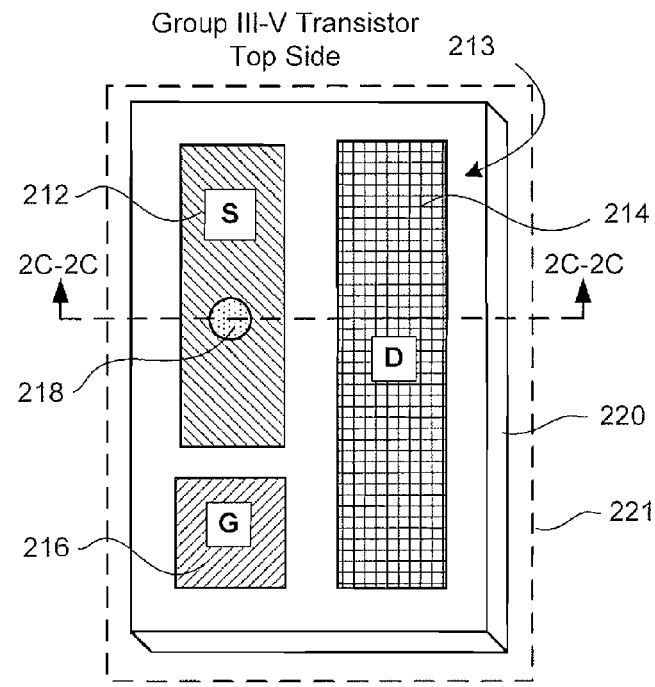
FIG. 2A shows a perspective view of a top side of an exemplary group III-V transistor suitable for use in a group III-V and group IV composite switch, according to one implementation.
Figure 2B:
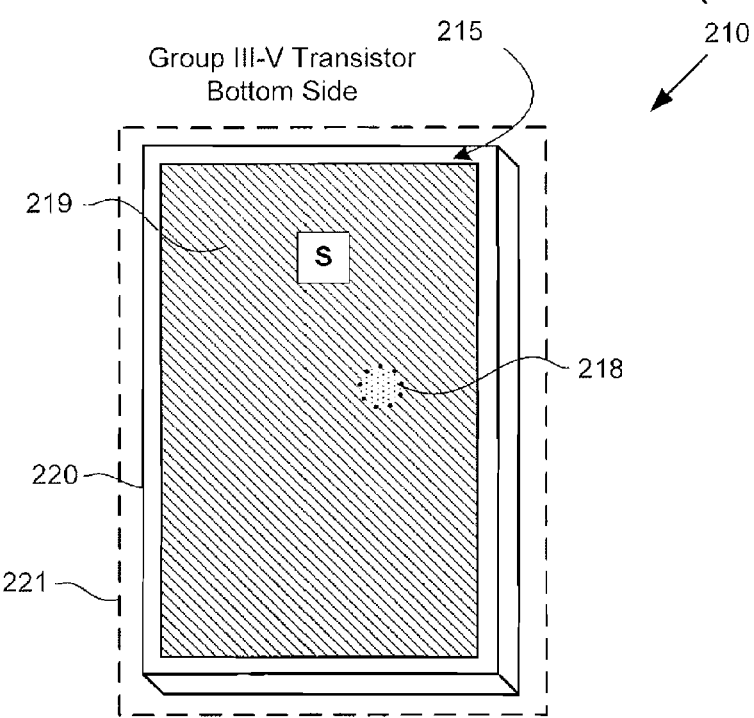
FIG. 2B shows a perspective view of a bottom side of the exemplary group III-V transistor shown in FIG. 2A.

Continuing to FIGS. 2A and 2B, FIG. 2A shows a perspective view of top side 213 of exemplary group III-V transistor 210 suitable for use in a group III-V and group IV composite switch, according to one implementation, while FIG. 2B shows a perspective view of bottom side 215 of group III-V transistor 210. As shown by FIG. 2A, group III-V transistor 210 includes active die 220 having lateral area 221 and including source electrode 212, drain electrode 214, and gate electrode 216 situated on top side 213 of active die 220. Source electrode 212, drain electrode 214, and gate electrode 216 correspond respectively to and are representative of the source, drain, and gate of group III-V transistor 210, situated on top side 213 of active die 220. Also shown in FIG. 2A is top side terminus of through-semiconductor via (TSV) 218 of active die 220 for electrically coupling source electrode 212 to source contact 219 on bottom side 215 of active die 220 (source contact 219 and bottom side terminus of TSV 218 shown in FIG. 2B).

It is noted that although the top side terminus of TSV 218 is visually depicted as "seen through" source electrode 212 in the interests of conceptual clarity, in practice the top side terminus of TSV 218 would be obscured by source electrode 212 and thus would not be visible from the perspective view shown by FIG. 2A. It is further noted that the bottom side terminus of TSV 218 is represented as having a dotted border and is depicted as "seen through" source contact 219 on bottom side 215 of active die 220. In practice the bottom terminus of TSV 218 would be obscured by at least the presence of source contact 219 and thus would not be visible from the perspective view shown by FIG. 2B.

In some implementations, as will be described more fully below by reference to FIG. 2C, TSV 218 may not extend through the entirety of active die 220, but rather may extend from source electrode 212 on top side 213 to reach a highly conductive substrate in active die 220. In such implementations, the highly conductive substrate may be formed as a silicon structure containing one or more layers. For example, the highly conductive substrate may include a lightly doped N type (i.e., N−) layer formed over a heavily doped N type (i.e., N+) layer. In certain implementations TSV 218 may extend through one or more layers within the highly conductive substrate to make contact with a highly conductive layer within the highly conductive substrate. In certain other implementations, the highly conductive substrate may be a silicon on insulator (SOI) substrate. In such an implementation, TSV 218 may extend down to either the thin device layer or layers formed over an insulating layer, or may extend down through the insulating layer to or into the handle layer formed below the insulating layer.

Although some of the implementations described below depict use of a single TSV, those of ordinary skill in the art will appreciate that other implementations of the present inventive principles may include multiple TSVs. Thus, as used herein, the term "through-semiconductor via" or "TSV" refers to at least one through-semiconductor via, but may include two or more through-semiconductor vias. In some implementations, the TSVs may be configured as an array of vias. Moreover, the TSVs may be distributed throughout the semiconductor structure (e.g., under the device electrodes), or they may be clustered together (e.g., under source or drain pads, or under one or more TSV pads), among other possible configurations.

Figure 2C:
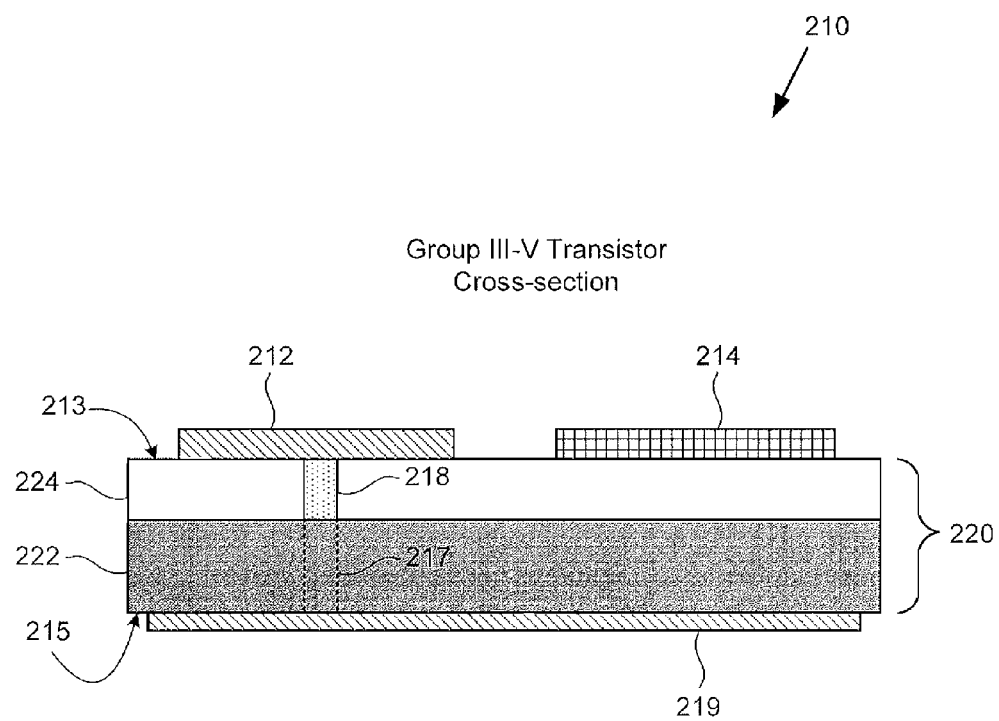
FIG. 2C shows a cross-sectional view of the exemplary group III-V transistor shown in FIGS. 2A and 2B from perspective 2C-2C in FIG. 2A.

Referring to FIG. 2C, FIG. 2C shows a cross-sectional view of exemplary group III-V transistor 210 from perspective 2C-2C in FIG. 2A. As shown in FIG. 2C, active die 220 having top side 213 and bottom side 215 includes substrate 222 and group III-V layer 224 formed over substrate 222. Also shown in FIG. 2C are TSV 218, source electrode 212, drain electrode 214, and source contact 219 electrically coupled to source electrode 212 through substrate 222 and/or TSV 218, as indicated by dashed lines 217 extending TSV 218 through active die 220 in some implementations.

Although depicted as a single layer in FIG. 2C, it is noted that group III-V layer 224 is typically implemented using multiple group III-V layers and includes a heterojunction configured to produce a 2 DEG. For example, in some implementations, group III-V layer 224 may include a heterojunction formed from a GaN channel layer and an AlGaN barrier layer disposed over the GaN channel layer, and configured to provide a III-Nitride HEMT.

Substrate 222 may be formed of any commonly utilized substrate material. For example, substrate 222 may be formed of sapphire, or may be a group IV substrate as described above in the "Definitions" section. In implementations in which substrate 222 is a non-native substrate for group III-V layer 224 (i.e., a non group III-V substrate such as a silicon or other group IV substrate), group III-V layer 224 typically includes group III-V transition layers formed between substrate 222 and a group III-V heterojunction. Such transition layers are configured to mediate the thermal coefficient of expansion mismatch between substrate 222 and the group III-V channel and barrier layers forming the group III-V heterojunction (i.e., GaN channel layer and AlGaN barrier layer). In such implementations, the specific compositions and thicknesses of the group III-V transition layers implemented as part of group III-V layer 224 may depend on the diameter and thickness of substrate 222, and the desired performance of group III-V transistor 210.

In some implementations, substrate 222 may be a highly conductive group IV substrate, such as a highly conductive silicon substrate, for example. It is noted that in implementations in which substrate 222 is highly conductive, TSV 218 need not extend through the entirety of active die 220 to electrically couple source electrode 212 and source contact 219 at bottom side 215 of active die 220. Instead, in those implementations, TSV 218 may extend from top side 213 of active die 220 only as far as necessary to reach highly conductive substrate 222. However, in implementations in which substrate 222 is not a highly conductive substrate, TSV 218 may extend through active die 220, as shown by dashed lines 217, to reach bottom side 215 of active die 220.

In other words, in some implementations, source electrode 212 and source contact 219 may be electrically coupled by TSV 218, while in other implementations, source electrode 212 and source contact 219 may be electrically coupled by TSV 218 and highly conductive substrate 222 in active die 220. It is noted that Group III-V transistor 210, shown by FIGS. 2A, 2B, and 2C, corresponds to group III-V transistor 110, in FIG. 1, and may share any of the features previously attributed to that corresponding group III-V transistor, above.

Those of ordinary skill in the art will appreciate in light of the present disclosure that other transistor configurations may be implemented, including a variety of layouts to electrically couple different regions of the transistor. For example, the electrodes may be implemented as source, drain, and gate electrodes, wherein the source and drain electrodes are formed as interdigitated finger electrodes coupled to respective common source and drain pads, as disclosed in U.S. Pat. No. 7,166,867, entitled "III-Nitride Device with Improved Layout Geometry," filed on Dec. 3, 2004, the entire disclosure of which is hereby incorporated fully by reference into the present application.

It is noted that in certain implementations, source electrode 212 may correspond to a source finger electrode, or to a common source electrode pad coupling several source finger electrodes, or may correspond to a TSV pad coupled to one or more source electrode pads and/or one or more source finger electrodes. Those of ordinary skill in the art will appreciate that an analogous drain electrode configuration could also correspond to drain electrode 214 (i.e., drain electrode 214 corresponding to a drain finger electrode, drain finger electrode pad(s), or drain TSV pad(s)). It is further noted that, in some implementations, gate electrode 216 can correspond to a gate finger electrode, or to a common gate electrode pad coupling several gate finger electrodes, or may correspond to a TSV pad coupled to one or more gate electrode pads and/or one or more gate finger electrodes.

Figure 3A:
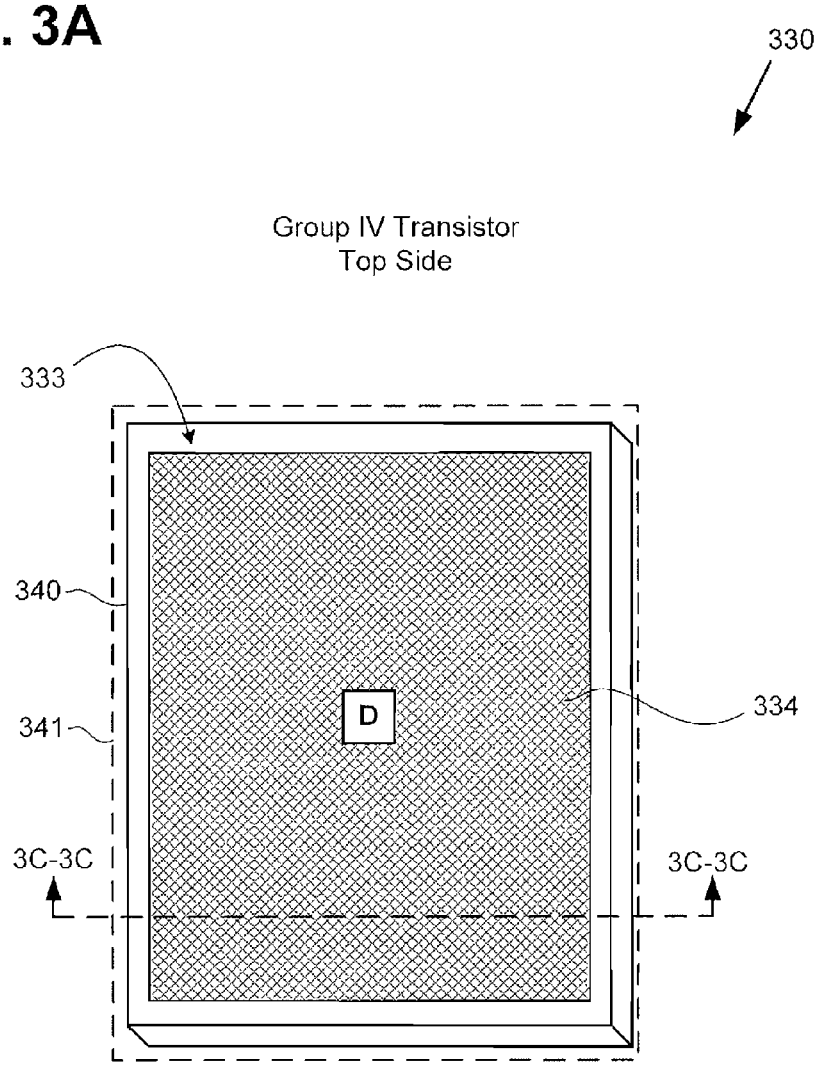
FIG. 3A shows a perspective view of a top side of an exemplary group IV transistor suitable for use in a group III-V and group IV composite switch, according to one implementation.
Figure 3B:
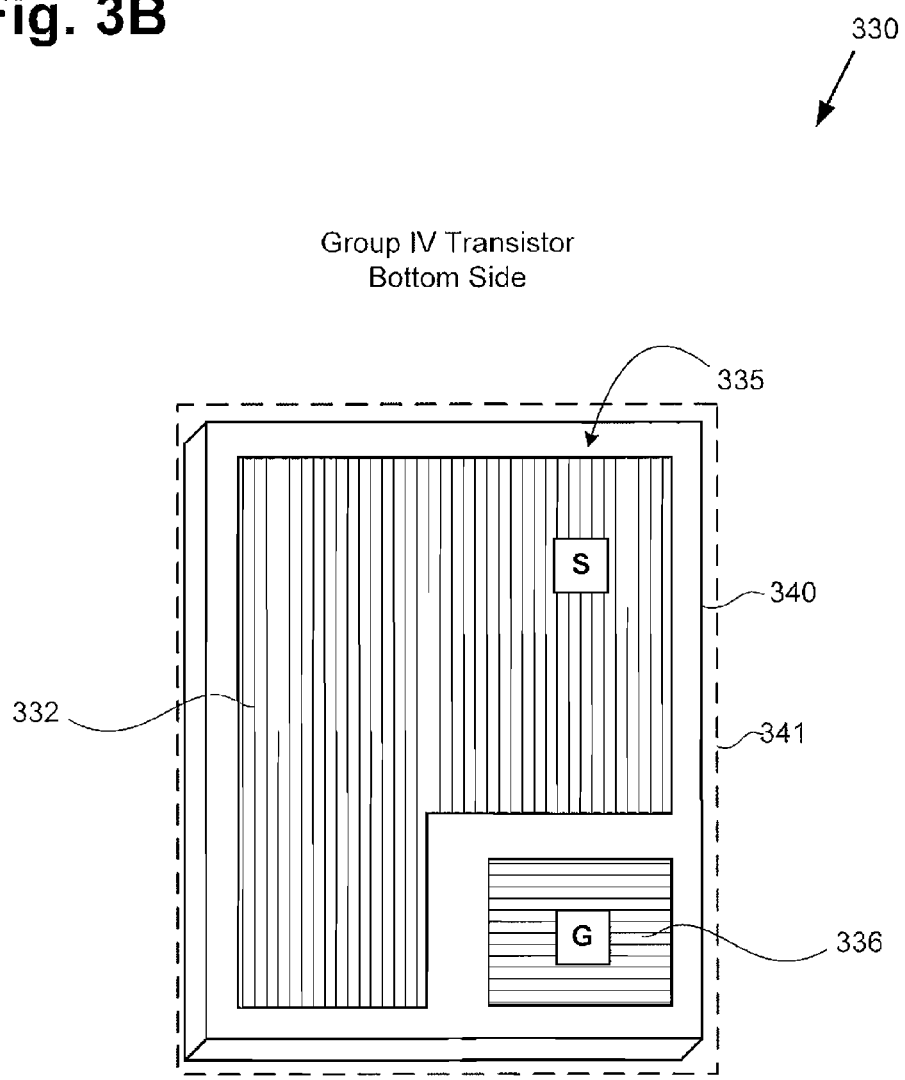
FIG. 3B shows a perspective view of a bottom side of the exemplary group IV transistor shown in FIG. 3A.
Figure 3C:
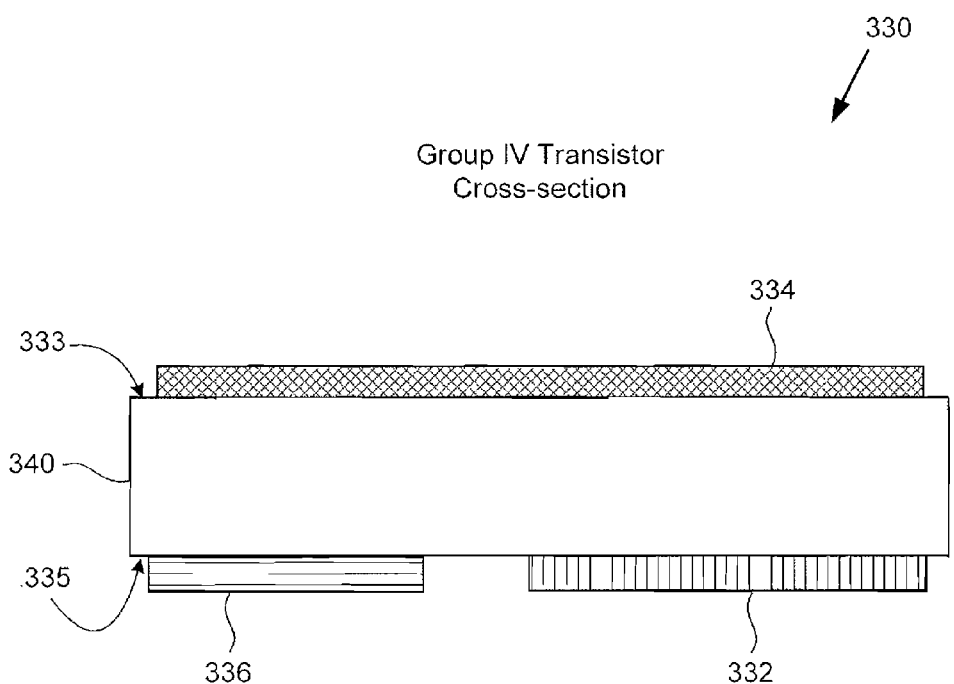
FIG. 3C shows a cross-sectional view of the exemplary group IV transistor shown in FIGS. 3A and 3B from perspective 3C-3C in FIG. 3A.

Moving to FIGS. 3A, 3B, and 3C, FIG. 3A shows a perspective view of top side 333, and FIG. 3B shows a perspective view of bottom side 335, of exemplary group IV transistor 330 suitable for use in a group III-V and group IV composite switch, according to one implementation. As shown by FIG. 3A, group IV transistor 330 includes active die 340 having lateral area 341. As further shown by FIG. 3A, group IV transistor 330 has drain electrode 334 situated on top side 333 of active die 340. Moreover, and as shown by FIG. 3B, group IV transistor 330 has source electrode 332 and gate electrode 336 situated on bottom side 335 of active die 340.

FIG. 3C shows a cross-sectional view of exemplary group IV transistor 330 from perspective 3C-3C in FIG. 3A. As shown in FIG. 3C, active die 340 includes source electrode 332 and gate electrode 336 situated on bottom side 335, and drain electrode 334 situated on top side 333. It is noted that group IV transistor 330 is implemented as a vertical transistor, such as a vertical silicon transistor, having a source and a gate situated on bottom side 335 of active die 340, and a drain situated on top side 333 of active die 340. Source electrode 332 and gate electrode 336, correspond respectively to the source and gate situated on bottom side 335, while drain electrode 334 corresponds to the drain situated on top side 333 of active die 340. It is further noted that Group IV transistor 330, shown by FIGS. 3A, 3B, and 3C, corresponds to group IV transistor 130, in FIG. 1, and may share any of the features previously attributed to that corresponding group IV transistor, above.

Figure 4A:
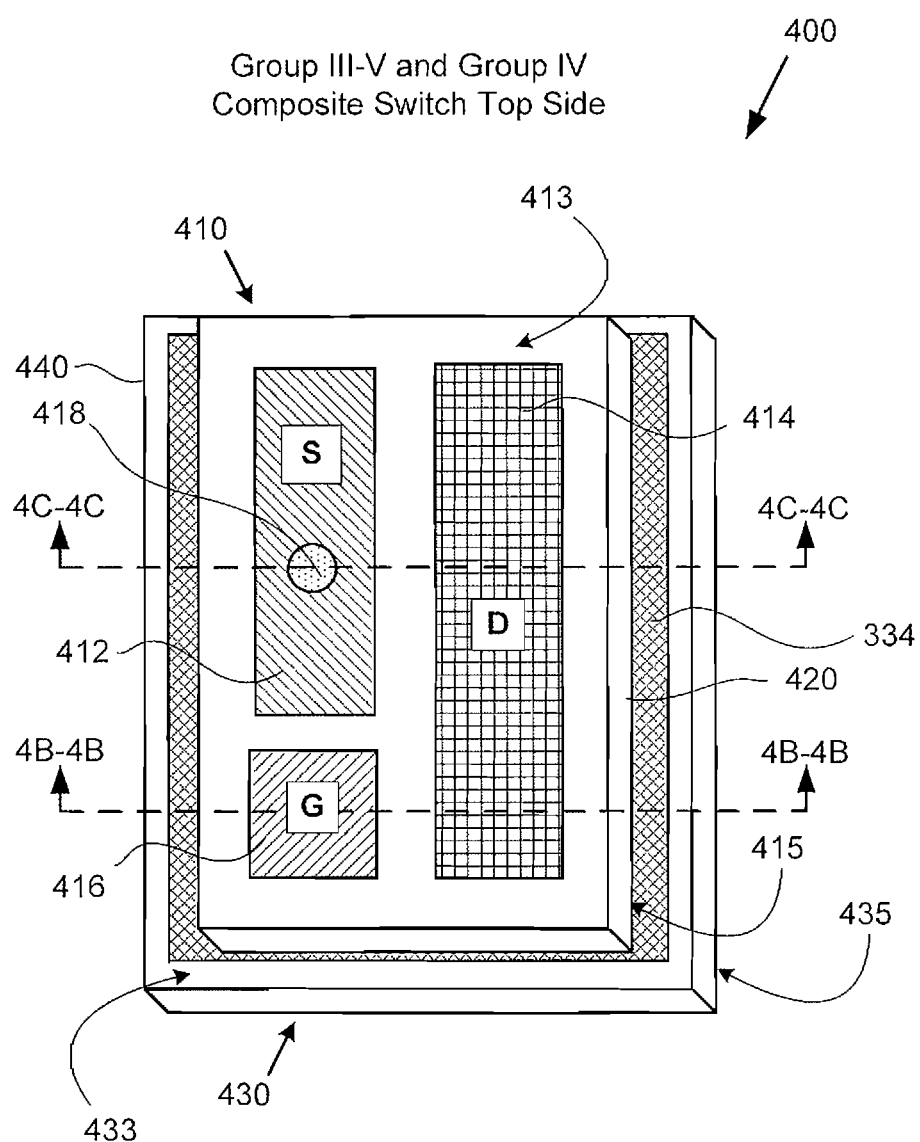
FIG. 4A shows a perspective view of an exemplary group III-V and group IV composite switch implemented using the transistors shown in FIGS. 2A, 2B, 2C, 3A, 3B, and 3C.
Figure 4B:
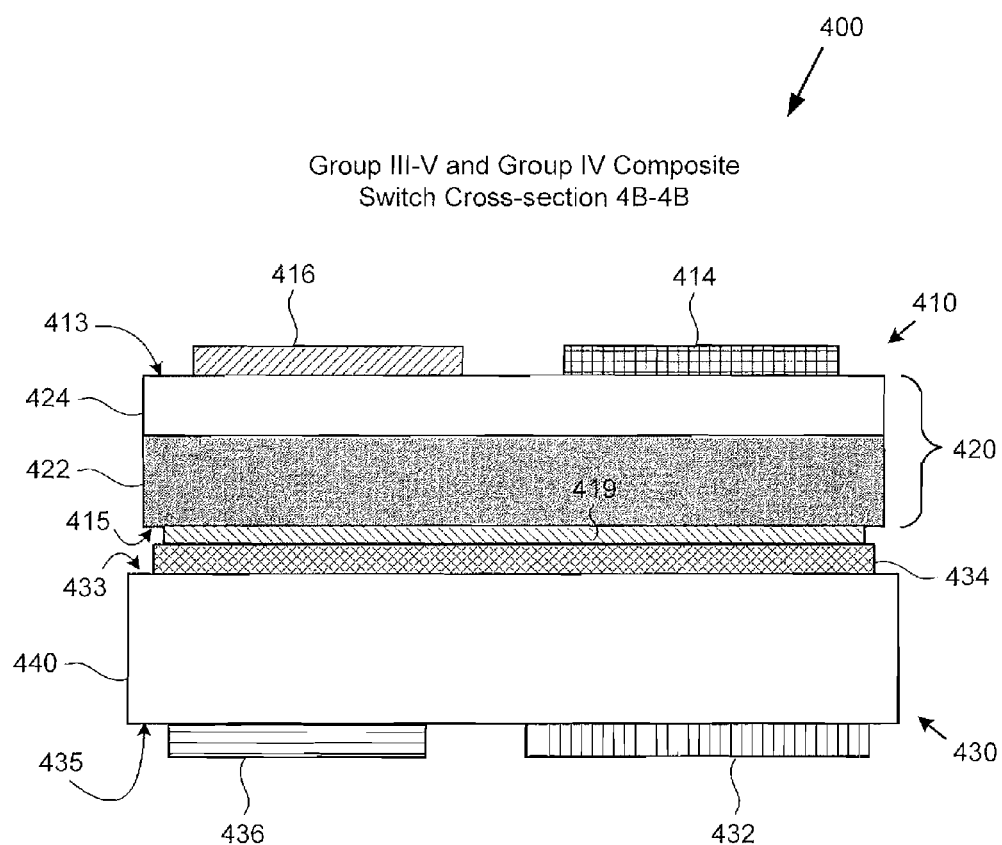
FIG. 4B shows a cross-sectional view of the exemplary group III-V and group IV composite switch shown in FIG. 4A from perspective 4B-4B in that figure.
Figure 4C:
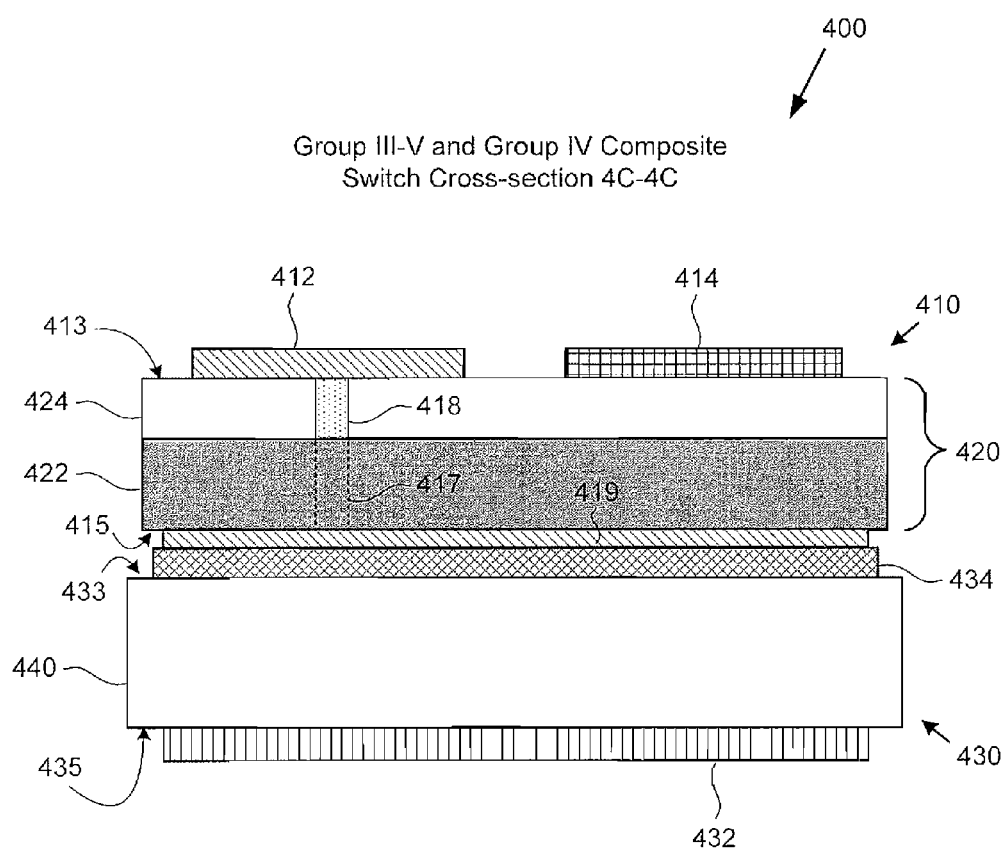
FIG. 4C shows a cross-sectional view of the exemplary group III-V and group IV composite switch shown in FIG. 4A from perspective 4C-4C in that figure.

Referring now to FIGS. 4A, 4B, and 4C, FIG. 4A shows a perspective view of an exemplary group III-V and group IV composite switch implemented using the transistors shown by FIGS. 2A, 2B, 2C, 3A, 3B, and 3C, while FIGS. 4B and 4C show cross-sectional views of the composite switch from perspectives 4B-4B and 4C-4C, respectively, in FIG. 4A. As shown in FIGS. 4A, 4B, and 4C, composite switch 400 is depicted as having a stacked configuration in which active die 420 including group III-V transistor 410 is stacked over active die 440 including group IV transistor 430. Thus, according to the present implementation active die 440 is a lower active die of composite switch 400, and active die 420 is an upper active die stacked over lower active die 440.

Composite switch 400 corresponds in general to composite switch 100, in FIG. 1. Moreover, group IV transistor 430, in FIGS. 4A, 4B, and 4C corresponds to group IV transistor 330, in FIGS. 3A, 3B, and 3C. Thus, group IV transistor 430 may be a vertical group IV transistor having a source and a gate corresponding respectively to source electrode 432 and gate electrode 436, on bottom side 435 of lower active die 440, and a drain corresponding to drain electrode 434, on top side 433 of lower active die 440.

In addition, group III-V transistor 410 corresponds to group III-V transistor 210, in FIGS. 2A, 2B, and 2C. Thus, substrate 422, group III-V layer 424, TSV 418, and dashed lines 417 extending TSV 418 through upper active die 420 in some implementations correspond respectively to substrate 222, group III-V layer 224, TSV 218, and dashed lines 217, in FIG. 2C. Moreover, drain electrode 414, source electrode 412, the top side terminus of TSV 418, and gate electrode 416, correspond respectively to drain electrode 214, source electrode 212, the top side terminus of TSV 218, and gate electrode 216, in FIG. 2A. It is noted that the top side terminus of TSV 418, in FIG. 4A, depicted as "seen through" source electrode 412, in FIG. 4A, would in fact not be visible from the perspective of FIG. 4A. Also shown in FIGS. 4B and 4C is source contact 419 on bottom side 415 of upper active die 420.

As explained above by reference to FIG. 2C, in some implementations, substrate 422, in FIGS. 4B and 4C may be a highly conductive group IV substrate, such as a highly conductive silicon substrate. As shown in FIG. 4C, in implementations in which substrate 422 is highly conductive, TSV 418 need not extend through the entirety of upper active die 420 to electrically couple source electrode 412 to drain electrode 434 of group IV transistor 430. That is to say, in some implementations, TSV 418 in upper active die 420 reaches bottom side 415 of upper active die 420, while in other implementations TSV 418 does not reach bottom side 415. Furthermore, in some implementations, highly conductive substrate 422 is in electrical contact with drain electrode 434 of group IV transistor 430, and TSV 418 reaches highly conductive substrate 422 in upper active die 420 to couple source electrode 412 of group III-V transistor 410 to drain electrode 434 of group IV transistor 430.

According to the implementation shown in FIGS. 4A, 4B, and 4C, composite switch 400 includes a composite gate electrode provided by gate electrode 436 of group IV transistor 430. In addition, composite switch 400 includes a composite drain electrode provided by drain electrode 414 of group III-V transistor 410. Moreover, gate electrode 416 of group III-V transistor 410, situated on top side 413 of upper active die 420, can be electrically coupled to source electrode 432 of group IV transistor 430, situated on bottom side 435 of lower active die 440. Once electrically coupled to gate electrode 416 of group III-V transistor 410, source electrode 432 of group IV transistor 430 is configured to provide a composite source electrode of composite switch 400.

As shown in FIGS. 4A, 4B, and 4C, composite switch 400 may be formed by stacking bottom side 415 of group III-V transistor 410 having source contact 419 formed thereon directly on top of drain electrode 434 of group IV transistor 430. In that implementation, upper active die 420 can be aligned such that source contact 419 of group III-V transistor 410 makes direct contact with drain electrode 434 of group IV transistor 430. Stacking of group III-V transistor 410 on top of group IV transistor 430 may be achieved using, for example, solder, conductive adhesive, conductive tape, sintering, or other attachment methods, resulting in formation of a direct mechanical contact between group IV transistor 430 and group III-V transistor 410. Such direct attachment of group IV vertical transistor 430 to group transistor 410 can advantageously reduce parasitic inductance and resistance, improve thermal dissipation, and reduce form factor and manufacturing cost compared to conventional composite switch designs.

With respect to the exemplary composite switch implementation shown in FIGS. 4A, 4B, and 4C it is noted that the features and characteristics represented by that specific example are depicted in detail merely as a conceptual aid, and are not to be interpreted as limitations. It is further noted that implementational details such as dimensions, and layouts, for example, may be highly dependent upon the particular transistors being utilized and the particular purpose for which the composite switch is designed.

For example, according to the present implementation, lower active die 440 has a larger lateral area (corresponding to lateral area 341, in FIGS. 3A and 3B) than a lateral area of upper active die 420 (corresponding to lateral area 221, in FIGS. 2A and 2B). However, that need not be the case in all implementations. Thus, in some implementations, the respective lateral areas of lower active die 440 and upper active die 420 may be similar or substantially equal. In those implementations in which active dies 440 and 420 have similar or substantially equal lateral areas, the topology of composite switch 400 may be flipped so that group IV transistor 430 in active die 440 is stacked over group III-V transistor 410 in active die 420. Consequently, in some implementations active die 420 may serve as the lower active die of composite switch 400, while active die 440 is implemented as the composite switch upper active die.

Figure 5A:
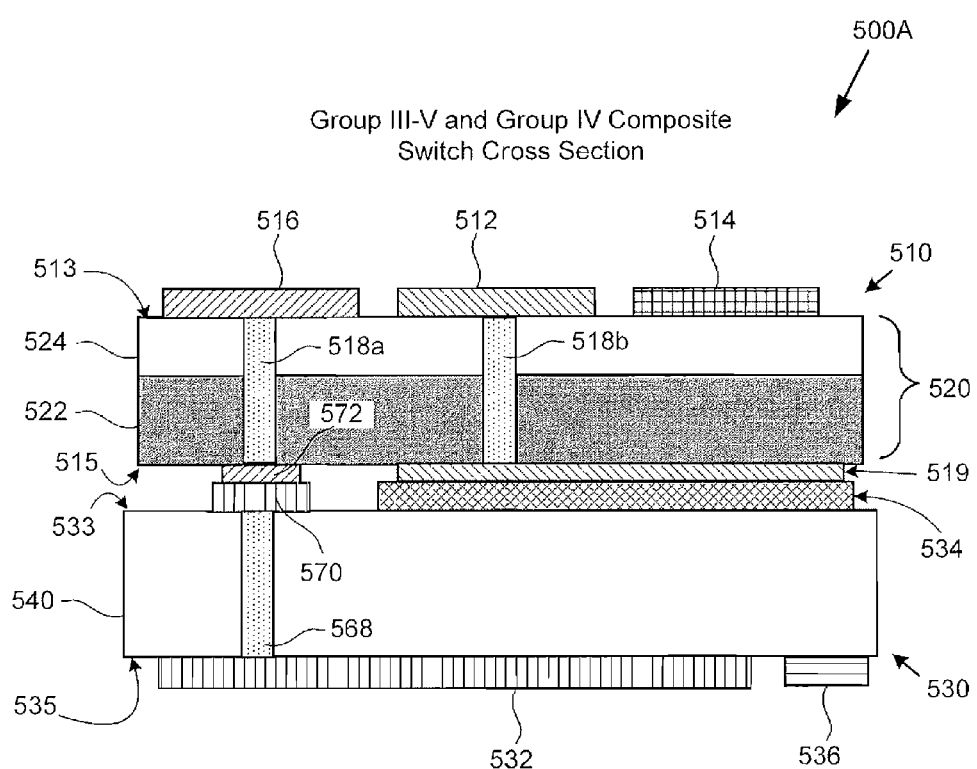
FIG. 5A shows a cross-sectional view of an exemplary group III-V and group IV composite switch, according to another implementation.
Figure 5B:
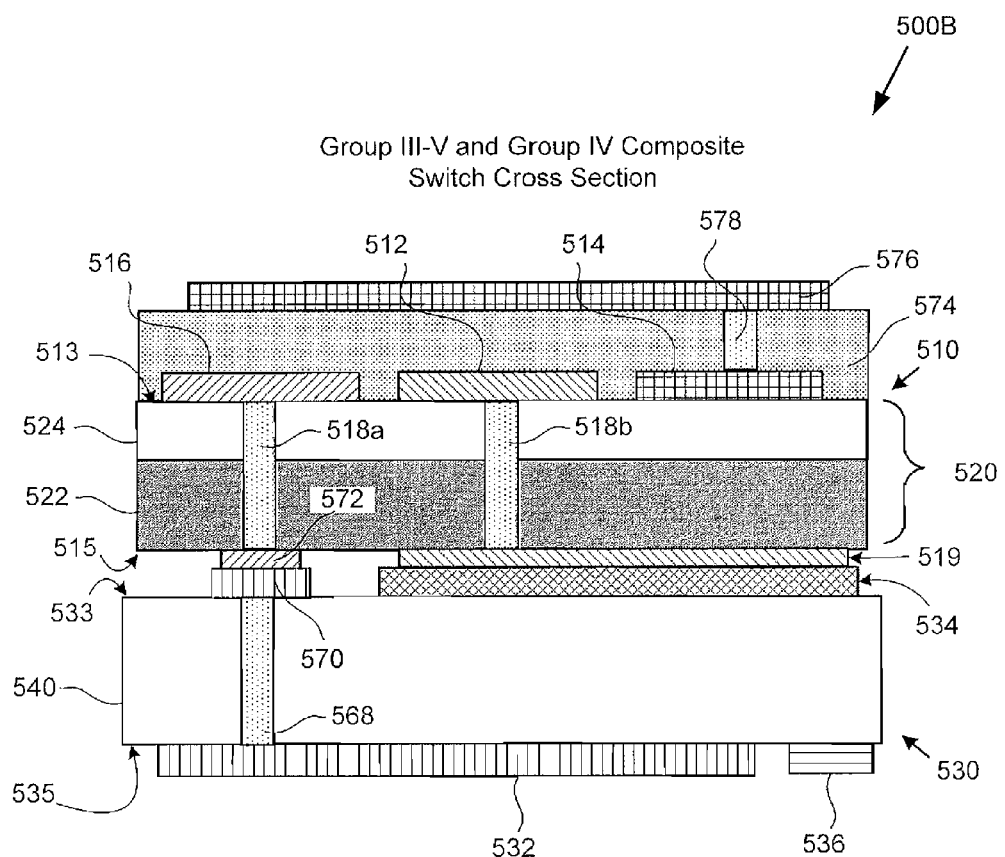
FIG. 5B shows a cross-sectional view of an exemplary group III-V and group IV composite switch, according to yet another implementation.

Referring now to FIGS. 5A and 5B, FIGS. 5A and 5B show cross-sectional views of respective group III-V and group IV composite switches 500A and 500B, according to other exemplary implementations. It is noted that exemplary group III-V and group IV composite switches 500A and 500B incorporate the use of a at least one TSV in the active die of the group III-V transistor coupled to another TSV in the active die of the group IV transistor. Group III-V and group IV composite switches 500A and 500B each includes group III-V transistor 510 with active die 520, and group IV transistor 530 having active die 540. It is noted that group III-V and group IV composite switches 500A and 500B correspond in general to group III-V and group IV composite switch 100, in FIG. 1.

Group IV transistor 530 may be a vertical group IV transistor having a source and a gate corresponding respectively to source electrode 532 and gate electrode 536 situated on bottom side 535 of lower active die 540. In addition, and as further shown by FIG. 5A, group IV transistor 530 includes TSV 568 and TSV-source interconnect 570 coupled to TSV 568 at top side 533 of lower active die 540, as well as a drain corresponding to drain electrode 534 on top side 533.

Group III-V transistor 510 may be a group III-V transistor having a substrate 522, group III-V layer 524, TSVs 518a and 518b, and TSV-gate interconnect 572 coupled to TSV 518a at bottom side 515 of upper active die 520. In addition, group III-V transistor 510 includes drain electrode 514, source electrode 512, and gate electrode 516 situated on top side 513 of upper active die 520. It is noted that TSV 518a is coupled at its top side terminus to gate electrode 516 of group III-V transistor 510, and at its bottom side terminus to TSV-gate interconnect 572. It is also noted that TSV 568 is coupled at its top side terminus to TSV-source interconnect 570 and at its bottom side terminus to source electrode 532 of group IV transistor 530.

FIGS. 5A and 5B further show source contact 519 situated on bottom side 515 of upper active die 520 and electrically coupled to source electrode 512 by TSV 518b. Also shown in FIG. 5B are insulator layer 574, drain contact 576 for group III-V transistor 510, and via 578 electrically coupling drain contact 576 to drain electrode 514 on top side 513 of upper active die 520.

According to the implementations shown in FIGS. 5A and 5B, group III-V and group IV composite switches 500A and 500B include a composite gate electrode provided by gate electrode 536 of group IV transistor 530. In addition, group III-V and group IV composite switches 500A and 500B include a composite drain electrode provided by drain electrode 514 in FIG. 5A, and by drain contact 576 in FIG. 5B. Moreover, gate electrode 516 of group III-V transistor 510, situated on top side 513 of upper active die 520, can be electrically coupled to source electrode 532 of group IV transistor 530, situated on bottom side 535 of lower active die 540, through TSV 518a, TSV-gate interconnect 572, TSV-source interconnect 570, and TSV 568. Once electrically coupled to gate electrode 516 of group III-V transistor 510, source electrode 532 of group IV transistor 530 is configured to provide a composite source electrode of group III-V and group IV composite switches 500A and 500B.

As shown in FIGS. 5A and 5B, group III-V and group IV composite switches 500A and 500B may be formed by stacking bottom side 515 of group III-V transistor 510 having source contact 519 and TSV-gate interconnect 572 formed thereon directly on top of drain electrode 534 and TSV-source interconnect 570 of group IV transistor 530. In that implementation, upper active die 520 can be aligned such that source contact 519 of group III-V transistor 510 makes direct contact with drain electrode 534 of group IV transistor 530. Also, TSV-gate interconnect 572 can make direct contact with TSV-source interconnect 570. Stacking of group III-V transistor 510 on top of group IV transistor 530 may be achieved using, for example, solder, conductive adhesive, conductive tape, sintering, or other attachment methods, resulting in formation of a direct mechanical contact between group IV transistor 530 and group III-V transistor 510. Such direct attachment of group IV transistor 530 to group III-V transistor 510 can advantageously reduce parasitic inductance and resistance, improve thermal dissipation, and reduce form factor and manufacturing cost compared to conventional composite switch designs.

Referring to FIG. 5B, group III-V and group IV composite switch 500B includes substantially all of the features of group III-V and group IV composite switch 500A, in FIG. 5A. However, the top side of group III-V and group IV composite switch 500B further includes planar drain pad or drain contact 576. Drain contact 576 is coupled to drain electrode 514 through via 578 formed within insulator layer 574. According to the implementation shown in FIG. 5B, insulator layer 574 should have sufficient thickness to prevent breakdown of insulator layer 574 between drain pad 576 and either gate electrode 516 or source electrode 512.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A composite switch comprising:
 a group IV transistor in a lower active die, a source and a gate of said group IV transistor being situated on a bottom side of said lower active die;
 a group III-V transistor in an upper active die stacked over said lower active die, a drain, a source, and a gate of said group III-V transistor being situated on a top side of said upper active die;
 said source of said group III-V transistor being electrically coupled to a drain of said group IV transistor using a through-semiconductor via (TSV) of said upper active die;
 a source contact of said group III-V transistor formed directly on top of a drain of said group IV transistor.

2. The composite switch of claim 1, wherein said group IV transistor is a vertical group IV transistor.

3. The composite switch of claim 1, wherein said TSV does not reach a bottom side of said upper active die.

4. The composite switch of claim 3, wherein said TSV reaches a highly conductive substrate in said upper active die, said highly conductive substrate being in electrical contact with said drain of said group IV transistor.

5. The composite switch of claim 1, wherein said TSV reaches a bottom side of said upper active die.

6. The composite switch of claim 1, wherein said group III-V transistor is a normally ON transistor and said composite switch is configured to be normally OFF.

7. The composite switch of claim 1, wherein said group III-V transistor is a high-voltage (HV) transistor and said group IV transistor is a low-voltage (LV) transistor.

8. The composite switch of claim 1, wherein said group III-V transistor is a III-Nitride high electron mobility transistor (III-Nitride HEMT).

9. The composite switch of claim 1, wherein said group transistor comprises gallium nitride (GaN).

10. The composite switch of claim 1, wherein said group IV transistor comprises silicon.

* * * * *